(12) United States Patent
Lai et al.

(10) Patent No.: US 8,853,783 B2
(45) Date of Patent: *Oct. 7, 2014

(54) ESD PROTECTION CIRCUIT

(71) Applicant: GlobalFoundries Singapore Pte. Ltd., Singapore (SG)

(72) Inventors: Da-Wei Lai, Singapore (SG); Ming Li, Singapore (SG); Jeoung Mo Koo, Singapore (SG); Purakh Raj Verma, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 13 days.

This patent is subject to a terminal disclaimer.

(21) Appl. No.: 13/669,409

(22) Filed: Nov. 5, 2012

(65) Prior Publication Data

US 2013/0187218 A1    Jul. 25, 2013

Related U.S. Application Data

(60) Provisional application No. 61/588,186, filed on Jan. 19, 2012.

(51) Int. Cl.
| H01L 23/62 | (2006.01) |
| H01L 29/66 | (2006.01) |
| H01L 29/78 | (2006.01) |

(52) U.S. Cl.
CPC ...................................... H01L 29/78 (2013.01)
USPC ................... 257/355; 257/328; 257/E29.256; 257/E29.257; 257/E21.418; 257/E21.015

(58) Field of Classification Search
CPC . H01L 29/78; H01L 29/7833; H01L 29/7835; H01L 29/73; H01L 29/0847; H01L 29/0692; H01L 29/1045; H01L 29/1087; H01L 29/41758; H01L 29/4238; H01L 29/4933; H01L 29/665; H01L 27/0266; H01L 27/0251; H01L 27/0277; H01L 27/02
USPC .................. 257/328, 329, 335, 355, E29.256, 257/E29.257, E21.418, E21.435, E29.015

See application file for complete search history.

(56) References Cited

U.S. PATENT DOCUMENTS

| 2005/0285200 A1* | 12/2005 | Kim ................................ 257/360 |
| 2007/0246738 A1* | 10/2007 | Otake ............................ 257/139 |
| 2010/0171149 A1* | 7/2010 | Denison et al. ................. 257/173 |
| 2011/0045629 A1* | 2/2011 | Ohkawa ............................ 438/87 |
| 2012/0032270 A1* | 2/2012 | Okumura et al. ............. 257/368 |

* cited by examiner

*Primary Examiner* — Chuong A Luu
*Assistant Examiner* — Moazzam Hossain
(74) *Attorney, Agent, or Firm* — Horizon IP Pte. Ltd.

(57) ABSTRACT

A device which includes a substrate defined with a device region having an ESD protection circuit is disclosed. The ESD protection circuit has a transistor. The transistor includes a gate having first and second sides. A first diffusion region is disposed adjacent to the first side of the gate and a second diffusion region is disposed in the device region displaced away from the second side of the gate. The first and second diffusion regions include dopants of a first polarity type. A drift isolation region is disposed between the gate and the second diffusion region. A first device well encompasses the device region and a second device well is disposed within the first device well. A drain well having dopants of the first polarity type is disposed under the second diffusion region and within the first device well.

20 Claims, 8 Drawing Sheets

ESD PROTECTION CIRCUIT

BACKGROUND

Traditional n-type lateral diffused metal oxide semiconductor (nLDMOS) has some inherent poor characteristics, such as "strong snapback kirk effect or base push out", which negatively affect or degrade its ESD performance. These negative characteristics result in non-uniform turn on of the nLDMOS or ESD device.

The disclosure is directed to reduce or prevent strong snapback or base push out phenomena and to provide transistors having improved ESD performance.

SUMMARY

Embodiments generally relate to semiconductor devices. In one embodiment, a device which includes a substrate defined with a device region having an ESD protection circuit is presented. The ESD protection circuit has a transistor. The transistor includes a gate having first and second sides. A first diffusion region is disposed in the device region adjacent to the first side of the gate and a second diffusion region is disposed in the device region displaced away from the second side of the gate. The first and second diffusion regions include dopants of a first polarity type. A drift isolation region is disposed between the gate and the second diffusion region. A first device well encompasses the device region and a second device well is disposed within the first device well. A drain well having dopants of the first polarity type is disposed under the second diffusion region and within the first device well.

In another embodiment, a device which includes a substrate having first and second device wells in a device region is disclosed. The second device well is disposed within the first device well. A transistor is disposed in the device region. The transistor includes a gate having first and second sides. A first diffusion region is disposed adjacent to the first side of the gate and a second diffusion region is displaced away from the second side of the gate. A drift isolation region is disposed between the gate and the second diffusion region. A drain well is disposed under the second diffusion region and within the first device well.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. ESD circuits are provided for the devices. For example, the ESD circuits may be used in high voltage applications or devices. ESD circuits, for example, are activated during an ESD event to dissipate ESD current. The devices, for example, may be any type of semiconductor devices, such as integrated circuits (ICs). Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

Figure 1A:
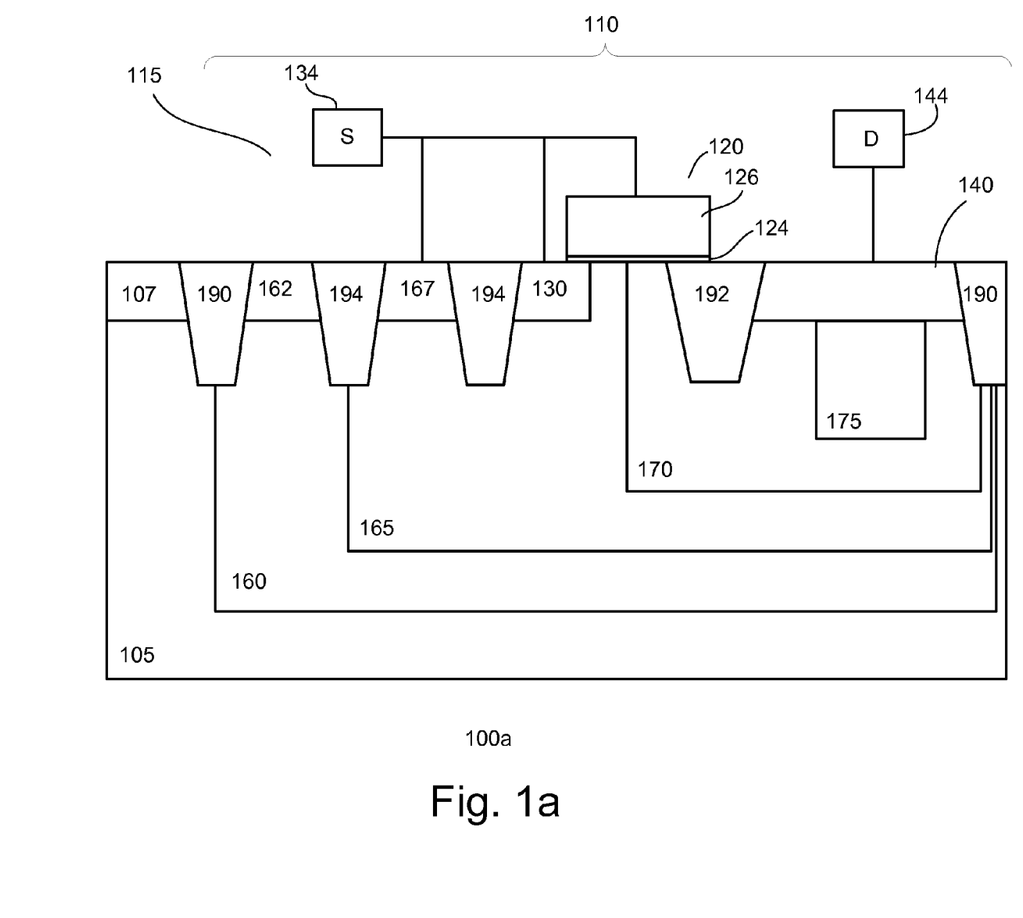
FIGS. 1a-d show cross-sectional views of various embodiments of a device.

FIG. 1a shows a cross-sectional view of an embodiment of a device 100a. As shown, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

The device may include doped regions or wells having different dopant concentrations. For example, the device may include heavily doped, intermediate doped and lightly doped regions. The doped regions may be designated by $x^-$, $x$ and $x^+$, where x indicates the polarity of the doping, such as p for p-type or n for n-type, and:

$x^-$=lightly doped;
$x$=intermediately doped; and
$x^+$=heavily doped.

A lightly doped region may have a dopant concentration of less than about $5E13/cm^3$. For example, a lightly doped region may have a dopant concentration of about $1E11/cm^3$-$5E13/cm^3$. An intermediate doped region may have a dopant concentration from about $5E13$-$5E15/cm^3$. For a heavily doped region, it may have a dopant concentration of more than about $5E15/cm^3$. For example, a heavily doped region may have a dopant concentration from about $5E15\ cm^3$-$9E15/cm^3$. Other concentrations of the different types of doped regions may also be useful. P-type dopants may include boron (B), aluminum (Al), indium (In) or a combination thereof, while n-type dopants may include phosphorus (P), arsenic (As), antimony (Sb) or a combination thereof.

As shown, the device includes a device region 110 defined on the substrate. A device isolation region 190 may be provided for isolating or separating the device region from other device regions on the substrate. In one embodiment, the device isolation region surrounds the device region. The isolation region, for example, is a shallow trench isolation (STI) region. Other types of isolation regions may also be employed. For example, the isolation region may be a deep trench isolation (DTI) region. The isolation region, for example, extends to a depth of about 4000 Å for a STI region. Providing isolation regions which extend to other depths, such as 0.5-10 μm for DTI regions, may also be useful. In one embodiment, the width of the isolation region is about 0.3 μm. Providing isolation regions having different depths and widths may also be useful. The dimensions, for example, may depend on isolation requirements.

The device region includes an ESD protection circuit 115. The ESD protection circuit, in one embodiment, is a lateral diffused (LD) transistor. For example, the ESD protection circuit is a LD metal oxide semiconductor (LDMOS) transistor.

In one embodiment, a first doped well 160 is disposed in the substrate in the device region. The first doped well, as shown, encompasses the complete device region. For example, the first doped well serves as a first device well which is disposed in the substrate from about an inner edge of the device isolation region. Providing the first doped well which extends from the bottom of the isolation region between inner and outer edges of the isolation region is also useful. In one embodiment, the first well serves as an isolation well. For example, the first well isolates the ESD protection circuit from the substrate. The first well should be sufficiently deep to serve as an isolation well.

The first well includes first polarity type dopants. In one embodiment, the first well is lightly doped with first polarity type dopants. For example, the dopant concentration of the first well may be about $1E11/cm^3$-$5E13/cm^3$. Providing a first well having other dopant concentrations may also be useful. In one embodiment, the first polarity type is n-type. For example, the first well may be $n^-$ well for a n-type device. Providing p-type as the first polarity type is also useful. For example a $p^-$ well may be employed for a p-type device.

A gate 120 of the transistor is disposed on the surface of the substrate in the device region. The gate includes a gate electrode 126 disposed over a gate dielectric 124. The gate electrode may be polysilicon. Other materials may also be useful. As for the gate dielectric, it may be silicon oxide. Other gate dielectric materials may also be useful. In one embodiment, the gate is similar to gates used for core devices. Other configurations of gates may also be useful.

The gate may be a gate conductor which forms gates of multiple transistors. For example, the gate conductor may traverse a plurality of device regions separated by isolation regions. The pluralities of transistors have a common gate formed by the gate conductor. Other configurations of gate conductors may also be useful.

The gate is disposed between first and second source/drain (S/D) regions 130 and 140. The S/D regions are first polarity type doped regions disposed in the substrate. The S/D regions are, for example, heavily doped first polarity type regions. For example, the S/D regions may have a depth of about 0.1-0.4 μm. Other depths may also be useful. The S/D regions may be similar to those of other transistors of the device. In one embodiment, the first S/D region is a source region and the second S/D region is a drain region of the transistor.

The first S/D region is disposed adjacent to a first side of the gate. In one embodiment, the gate overlaps the first S/D region. For example, the first side of the gate overlaps the first S/D region. The amount of overlap should be sufficient for the first S/D region to be in communication with a channel of the transistor under the gate. The amount of overlap, for example, is about 0.1-0.5 μm. Overlapping the first S/D region by other amounts may also be useful. In one embodiment, the gate overlaps a lightly doped region of the first S/D region. Other configurations of the first S/D region may also be useful. As for the second S/D region, it is displaced away from a second side of the gate. The displacement may be, for example, referred to as the drift distance.

In one embodiment, a drift isolation region 192 is provided between the gate and the second S/D region. The drift isolation region, for example, is a STI. Other types of drift isolation region may also be useful. As shown, the gate overlaps the drift isolation. The drift isolation region can be employed to increase the effective drift distance. For example, the drift distance can be increased to be equal to the profile of the drift isolation region.

Sidewalls of the gate may be provided with dielectric spacers (not shown). The dielectric spacers, for example, may be silicon oxide spacers. Other types of dielectric materials may also be useful, such as silicon nitride or a combination of dielectric materials or layers. For example, the spacers may be composite spacers. The spacers may facilitate forming the lightly doped and S/D regions. For example, the lightly doped region is formed prior to spacer formation while the first S/D region is formed after spacer formation. Other configurations of spacers may also be useful. For example, the spacer may be a single spacer. In some cases, the transistor may also include a halo region. The halo region is a second polarity doped region abutting the lightly doped and first S/D regions under the gate.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor, such as the gate electrode and doped regions. In some embodiments, the etch stop layer may also serve as a stress layer for applying a stress on a channel of the transistor below the gate to improve performance.

A second well 165 is disposed in the substrate. The second well may be disposed in the device region. For example, the second well is disposed within the first well. The second well serves as a body well of the ESD device. The second device well includes second polarity dopants for a first polarity type device. For example, the second device well comprises p-type dopants for an n-type device or n-type dopants for a p-type device. The dopant concentration may depend on the voltage requirement of the device. The second device well may be lightly ($x^-$) or intermediately (x) doped with second polarity type dopants. For example, the second well may be p type well for a n-type device. Other dopant concentration for the second device well suitable for, for example, high voltage applications, may also be useful.

The body well at least encompasses the first S/D region and a part of the gate. As shown, the body well encompasses the first and second S/D regions. Other configurations of the second well may also be useful. A depth of the second well is shallower than the first well.

The first and second wells, in one embodiment, are provided with first and second well contacts 162 and 167 for biasing the wells. The well contacts are heavily doped regions, similar to the S/D regions. For example, a depth of the well contact is shallower than a depth of the device isolation region and the well contacts are in communication with the respective wells. The dopant concentration of the well contacts may be about $5E15\ cm^3$-$9E15/cm^3$. The well contacts have the same polarity type as the wells. For example, the first well contact is a first polarity type doped region and the second well contact is a second polarity type doped region.

In one embodiment, isolation regions 194 may be provided to separate the contact regions. The isolation regions may be STI regions. For example, the isolation regions may be similar to the device isolation regions. Other types or configurations of isolation regions may also be useful.

Metal silicide contacts (not shown) may be formed on the gate electrode and various contact regions. For example, metal silicide contacts may be provided over the S/D regions, well contacts and gate electrode. The silicide contacts, for example, may be nickel-based contacts. Other types of metal silicide contacts may also be useful. For example, the silicide contacts may be cobalt silicide (CoSi) contacts. The silicide contacts may be about 100-500 Å thick. Other thickness of the silicide contacts may also be useful. The silicide contacts may be employed to reduce contact resistance and facilitate contact to the back-end-of-line metal interconnects.

In one embodiment, a third well 170 is provided. The third well is disposed in the substrate within the second well. For example, a depth of the third well is shallower than a depth of the second well. The third well serves as a drift well. In one embodiment, the third well encompasses the second S/D region and extends under the gate. The gate overlaps the third or drift well, creating a gate overlap region $O_{gate}$. In the case where an internal isolation region is provided, the $O_{gate}$ is between an edge of the third well (e.g., inner edge of the third well) under the gate and an edge of the drift isolation region (e.g., inner edge of the drift isolation region) under the gate. In one embodiment, $O_{gate}$ is about 0.2-2 μm. Providing other values of $O_{gate}$ may also be useful. The width, for example, may depend on design requirements.

In one embodiment, the depth or bottom of the third well is below the isolation regions. For example, the drift well extends from a bottom of the device isolation region to under the gate. The depth of the third well may be about 0.1-5 μm. Other depths may also be useful. The depth, for example, may depend on the design voltage of the device. The substrate under the gate between the first S/D region and third well forms a channel of the transistor. The effective drift distance is from the second S/D region, around the drift isolation region and to the channel under the gate.

The drift well includes first polarity type dopants. In one embodiment, the dopant concentration of the drift well is lower than the dopant concentration of the drain. In one embodiment, the drift well may be lightly ($x^-$) or intermediately ($x$) doped with first polarity type dopants. For example, the dopant concentration of the drift well is about 1E12-1E14/cm$^2$. Other dopant concentrations may also be useful. For example, the dopant concentration may depend on the maximum or breakdown voltage requirement of the device.

In one embodiment, the second well, the first S/D region and gate are commonly coupled to a first terminal 134 of the ESD device. The second S/D region is coupled to a second terminal 144 of the ESD device. For example, the first terminal is a source terminal and the second terminal is a drain terminal. The source terminal, for example, is coupled to ground while the drain terminal, for example, is coupled to $V_{DD}$ or I/O pad. Other configurations of terminal connections to the ESD devices may also be useful.

In accordance with one embodiment, a fourth well 175 is provided. The fourth well, for example, serves as a second S/D or drain well. The drain well is disposed in the substrate under the drain region. The width of the fourth well may be, for example, narrower than, the same as, or larger than the width of the drain, depending on the operation voltage. The depth of the drain well is between the bottom of the drift isolation region and body well. Other depths for the drain well may also be useful.

The drain well includes first polarity type dopants. In one embodiment, the dopant concentration of the drain well is between the second S/D region and drift well. In one embodiment, the drain well may be intermediately (x) doped with first polarity type dopants. Other dopant concentrations may also be useful.

We have discovered that, by providing a drain well under the drain, lower resistance path is created in the vertical direction. As such, current is directed to flow in the vertical direction instead of in the horizontal direction. Thus, base push-out phenomenon is relaxed or depressed at an early stage. This results in improved and more uniform turn on of the ESD device.

Figure 1B:
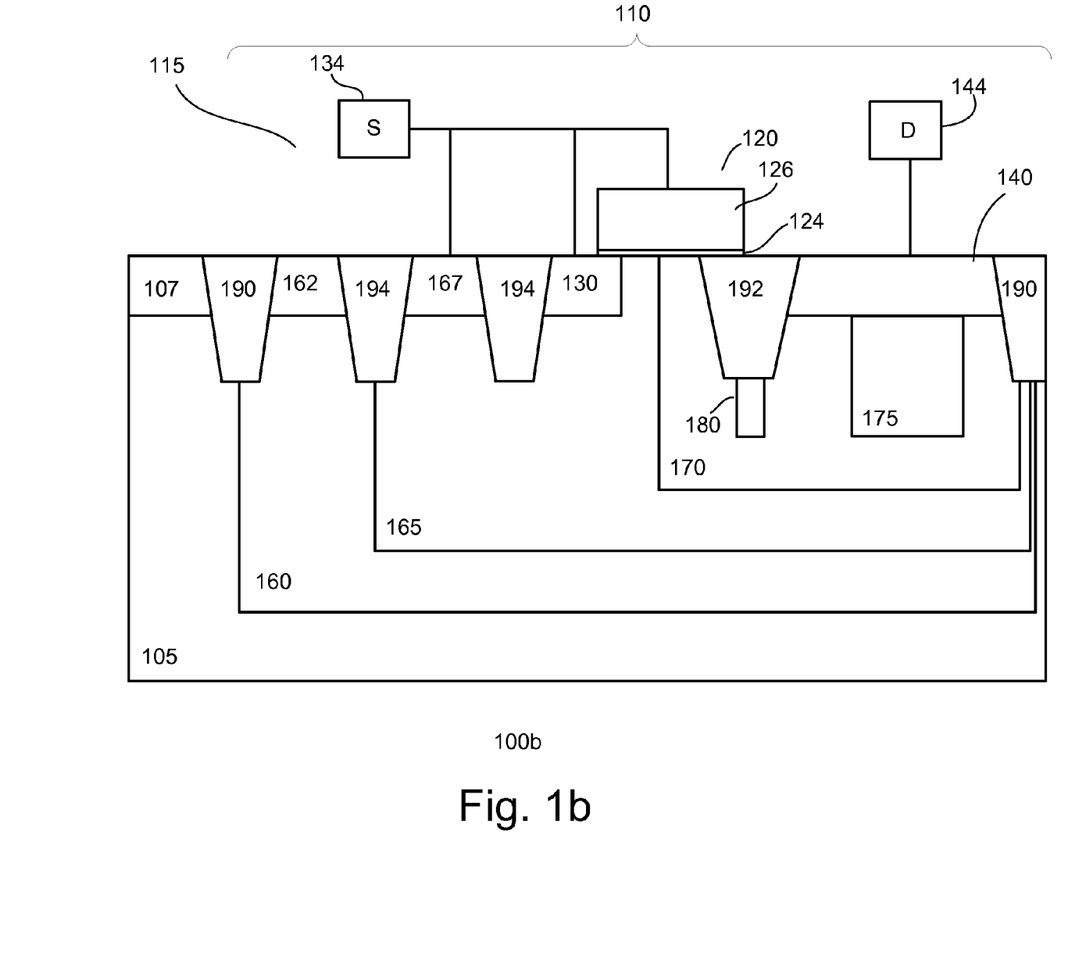

FIG. 1b shows a cross-sectional view of another embodiment of a device 100b. The device 100b is similar to the device of FIG. 1a. Common elements may not be described or described in detail. As shown, a substrate 105 is provided with a device region isolated by a device isolation region 190. The device region includes a LD transistor 115 which serves as an ESD protection circuit. The device region includes first, second, third and fourth doped wells 160, 165, 170 and 175. The first well may serve as an isolation well, the second well serves as a body well, the third well serves as a drift well and the fourth well serves as a drain well. Well contact regions 162 and 167 may be provided. Isolation regions, such as a drift isolation region 192 and well contact isolation regions 194 may be provided. Metal silicide contacts may be provided on the gate electrode, S/D and well contact regions.

In one embodiment, a fifth well 180 is provided. The fifth well serves as a low voltage (LV) well. The LV well includes second polarity type dopants. The LV well is disposed within the drift well. In one embodiment, the LV well is disposed between the drain well and inner edge of the drift well. As shown, the LV well is disposed under the drift isolation region 192. For example, the LV well is disposed under the center of the drift isolation region.

The LV well has been found to increase the holding voltage ($V_h$) of the ESD device. We have discovered that by providing a LV well, the base push-out phenomenon is depressed. It is believed that the LV well provides a high resistance path for the current in the horizontal direction. As such, current is directed to flow in the vertical direction instead of in the horizontal direction. This results in improved and more uniform turn on of the ESD device.

Figure 1C:
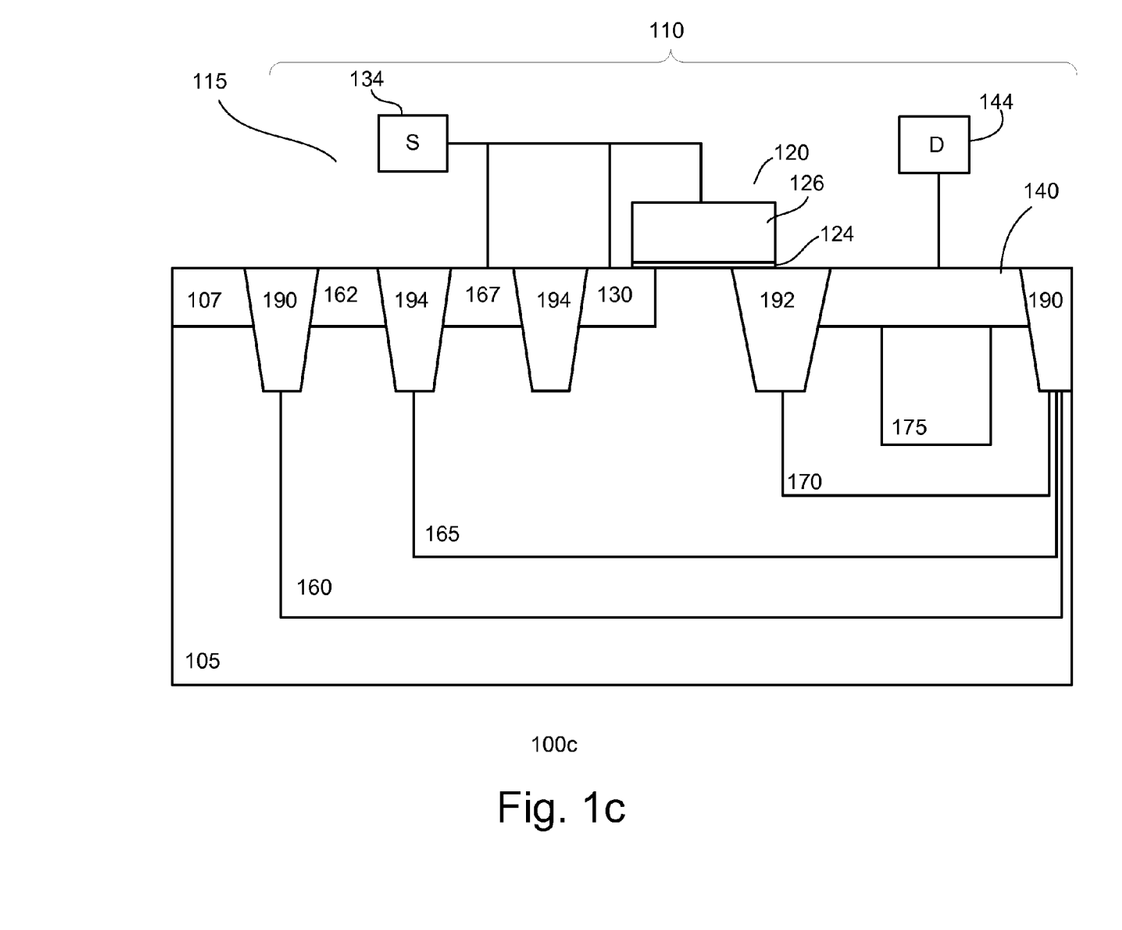

FIG. 1c shows a cross-sectional view of yet another embodiment of a device 100c. The device 100c is similar to the device of FIG. 1a. Common elements may not be described or described in detail. As shown, a substrate 105 is provided with a device region isolated by a device isolation region 190. The device region includes a LD transistor 115 which serves as an ESD protection circuit. The device region includes first, second, third and fourth doped wells 160, 165, 170 and 175. The first well may serve as an isolation well, the second well serves as a body well, the third well serves as a drift well and the fourth well serves as a drain well. Well contact regions 162 and 167 may be provided. Isolation regions, such as a drift isolation region 192 and well contact isolation regions 194 may be provided. Metal silicide contacts may be provided on the gate electrode, S/D and well contact regions.

In accordance with one embodiment, the drift well is narrowed. As shown, the drift well is narrowed so that the inner edge does not extend below the gate and does not extend into the channel region. For example, the inner edges of the drift well are below the center of the drift isolation region 192 and the device isolation region 190.

The narrowing of the drift well has been found to increase the holding voltage ($V_h$) of the ESD device. We have discovered that by narrowing the drift well, the base push-out phenomenon is depressed. This increases the base of the parasitic bipolar transistor (BJT) of the ESD circuit, which reduces the base push-out phenomenon to result in improved uniform turn on of the ESD device.

Figure 1D:
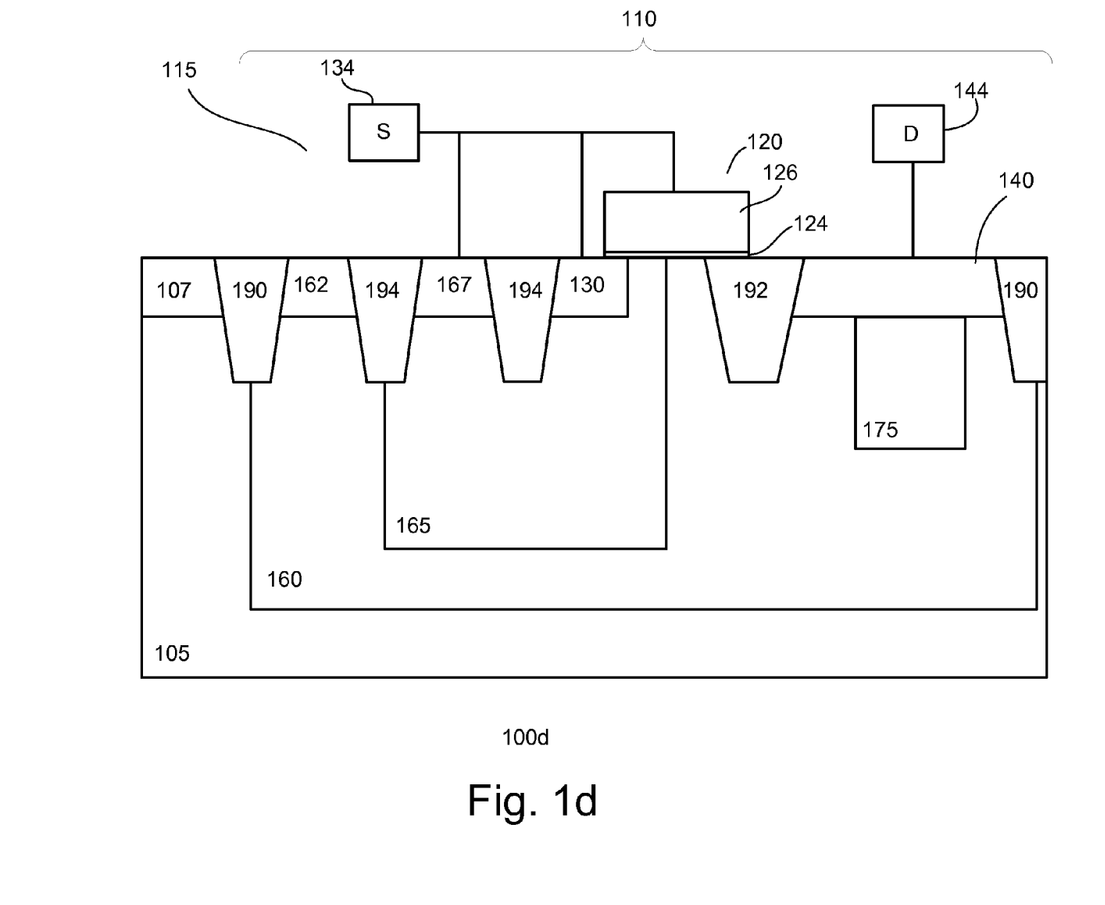

FIG. 1d shows a cross-sectional view of yet another embodiment of a device 100d. The device 100d is similar to the device of FIG. 1a. Common elements may not be described or described in detail. As shown, a substrate 105 is provided with a device region isolated by a device isolation region 190. The device region includes a LD transistor 115 which serves as an ESD protection circuit. The device region includes first, second, and fourth doped wells 160, 165 and 175. The first well may serve as an isolation well, the second well serves as a body well and the fourth well serves as a drain well. Well contact regions 162 and 167 may be provided. Isolation regions, such as a drift isolation region 192 and well contact isolation regions 194 may be provided. Metal silicide contacts may be provided on the gate electrode, S/D and well contact regions.

In accordance with one embodiment, unlike the device 100a of FIG. 1a, no drift well is provided. The body well, as shown, at least encompasses the first S/D region and a part of the gate. As shown, the body well encompasses the first S/D region and a part of the gate from a first side of the gate. Without the drift well, the drain is coupled to the channel by the isolation well. The drain well, for example, may be optimized depending on the total drain area. Eliminating the drift well eliminates base push-out phenomenon. The current is directed to flow only in the vertical direction. This results in improved and more uniform turn on of the ESD device. We have also discovered that this configuration improves ESD performance.

Figure 2A:
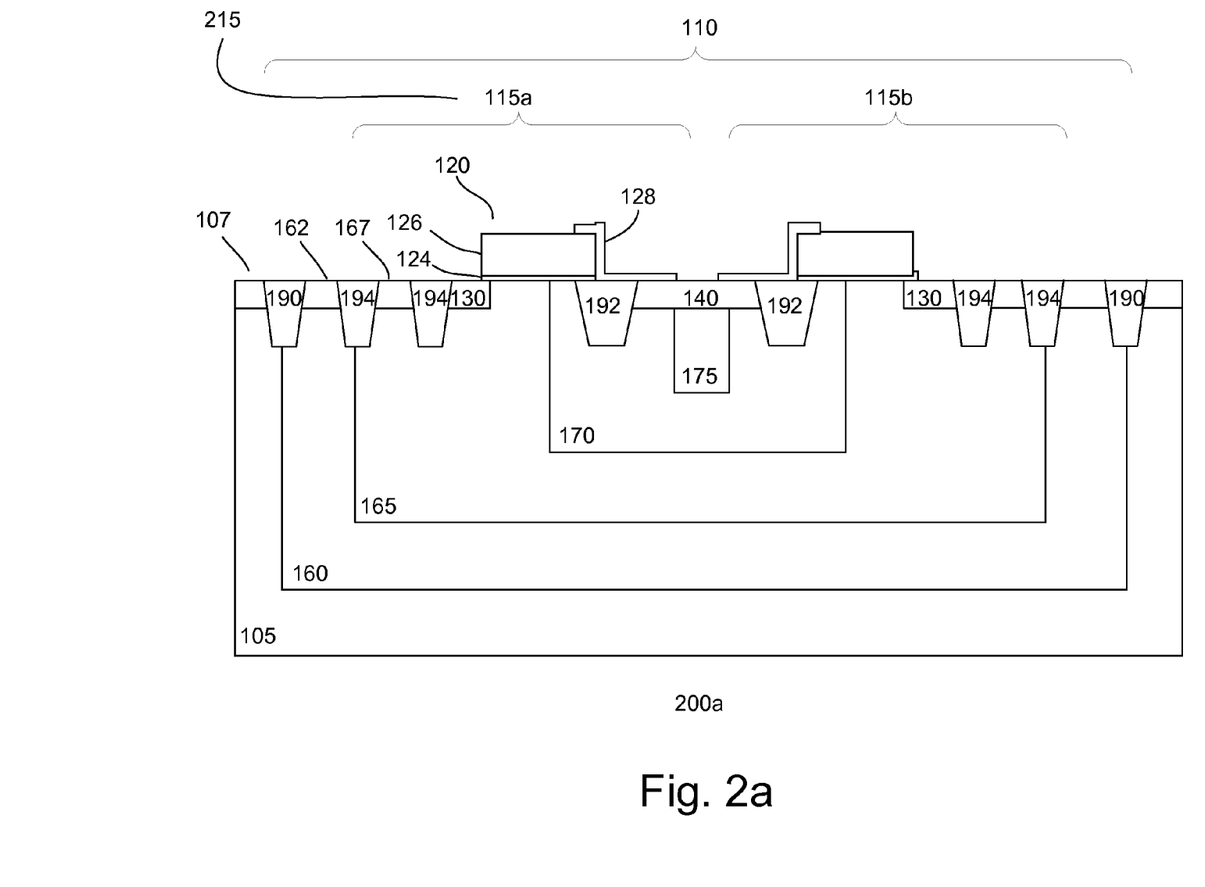
FIGS. 2a-d show cross-sectional views of other various embodiments of a device.

FIG. 2a shows a cross-sectional view of an alternative embodiment of a device 200a. The device is similar to the device 100a of FIG. 1a. Common elements may not be described or described in detail. As shown, a substrate 105 is provided. The substrate, for example, is a semiconductor substrate, such as a silicon substrate. Other types of substrates may also be useful. A device region 110 is defined on the substrate. A device isolation region 190 may be provided for isolating or separating the device region from other device regions on the substrate. In one embodiment, the device isolation region surrounds the device region. The isolation region, for example, is a shallow trench isolation (STI) region. Other types of isolation regions may also be employed.

The device region includes an ESD protection circuit 215. The ESD protection circuit includes a plurality of LD transistors coupled in parallel. For example, the ESD protection circuit includes n LD transistors. As shown, the device region includes first and second (e.g., n=2) LD transistors 115a-b. Providing other number of LD transistors may also be useful.

A first doped well 160 is disposed in the substrate in the device region. The first doped well, as shown, encompasses the complete device region. For example, the first doped well serves as an isolation well. The first well includes first polarity type dopants. In one embodiment, the first well is lightly doped with first polarity type dopants. Providing a first well having other dopant concentrations may also be useful.

A transistor includes a gate 120 which is disposed on the surface of the substrate in the device region. The gate includes a gate electrode 126 disposed over a gate dielectric 124. The gate may be a gate conductor which forms gates of multiple transistors. The gate is disposed between first and second source/drain (S/D) regions 130 and 140. The first S/D region is disposed adjacent to a first side of the gate. In one embodiment, the gate overlaps the first S/D region. For example, the first side of the gate overlaps the first S/D region. The amount of overlap should be sufficient for the first S/D region to be in communication with a channel of the transistor under the gate. The amount of overlap is, for example, about 0.1-0.5 μm. In one embodiment, the gate overlaps a lightly doped (LD) region of the first S/D region. Other configurations of the first S/D region may also be useful. As for the second S/D region, it is displaced away from a second side of the gate. The displacement may be, for example, referred to as the drift distance.

In one embodiment, a drift isolation region 192 is provided between the gate and the second S/D region. The drift isolation region, for example, is a STI. Other types of drift isolation region may also be useful. As shown, the gate overlaps the drift isolation. The drift isolation region can be employed to increase the effective drift distance. For example, the drift distance can be increased to be equal to the profile of the drift isolation region.

Sidewalls of the gate may be provided with dielectric spacers 128. The dielectric spacers, for example, may be silicon oxide spacers. Other types of dielectric materials may also be useful, such as silicon nitride or a combination of dielectric materials or layers. For example, the spacers may be composite spacers. The spacers may facilitate forming the lightly doped diffusion and S/D regions. For example, the lightly doped diffusion region is formed prior to spacer formation while the first S/D region is formed after spacer formation. Other configurations of spacers may also be useful. For example, the spacer may be a single spacer. In some cases, the transistor may also include a halo region. The halo region is a second polarity doped region abutting the lightly doped diffusion and first S/D regions under the gate.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer thereover. The etch stop layer facilitates in forming contact plugs to contact regions of the transistor, such as the gate electrode and doped regions. In some embodiments, the etch stop layer may also serve as a stress layer for applying a stress on a channel of the transistor below the gate to improve performance.

As shown, the first and second LD transistors are configured to have a common second S/D or drain region. Other configurations of the LD transistors may also be useful.

A second well 165 is disposed in the substrate. The second well may be disposed in the device region. For example, the second well is disposed within the first well. The second well serves as a body well for the transistors. The second device well includes second polarity dopants. The second device well may be lightly (x⁻) or intermediately (x) doped with first polarity type dopants. Other dopant concentration for the second device well may also be useful.

The body well at least encompasses the first S/D regions and a part of the gates. As shown, the body well encompasses the first and second S/D regions. Other configurations of the second well may also be useful. A depth of the second well is shallower than the first well. Providing the second well with other depths may also be useful.

The first and second wells, in one embodiment, are provided with first and second well contacts 162 and 167 for biasing the wells. The well contacts are heavily doped regions, similar to the S/D regions. For example, a depth of the well contact is shallower than a depth of the device isolation region and the well contacts are in communication with the respective wells. The dopant concentration of the well contacts may be about $5E15\ cm^3$-$9E15/cm^3$. The well contacts have the same polarity type as the wells. For example, the first well contacts are first polarity type doped regions and the second well contacts are second polarity type doped regions.

In one embodiment, isolation regions 194 may be provided to separate contact regions. The isolation regions may be STI regions. For example, the isolation regions may be similar to the device isolation regions. Other types or configurations of isolation regions may also be useful.

Metal silicide contacts (not shown) may be formed on the gate electrode and various contact regions. For example, metal silicide contacts may be provided over the S/D regions, well contacts and gate electrode. The silicide contacts, for example, may be nickel-based contacts. Other types of metal silicide contacts may also be useful. For example, the silicide contacts may be cobalt silicide (CoSi) contacts. The silicide contacts may be about 100-500 Å thick. Other thickness of silicide contacts may also be useful. The silicide contacts may be employed to reduce contact resistance and facilitate contact to the back-end-of-line metal interconnects.

In one embodiment, a third well 170 is provided. The third well is disposed in the substrate within the second well. For example, a depth of the third well is shallower than a depth of the second well. The third well serves as a drift well. In one embodiment, the third well encompasses the second S/D region and extends under the gates. The gates overlap the third or drift well, creating gate overlap regions $O_{gate}$.

In one embodiment, the depth or bottom of the third well is below the isolation regions. For example, the drift well extends from a bottom of the device isolation region to under the gate. The depth of the third well may be about 0.1-5 µm. Other depths may also be useful. The depth, for example, may depend on the design voltage of the device. The substrate under the gate between the first S/D region and third well forms a channel of the transistor. The effective drift distance is from the second S/D region, around the drift isolation region and to the channel under the gate.

The drift well includes first polarity type dopants. In one embodiment, the dopant concentration of the drift well is lower than the dopant concentration of the drain. In one embodiment, the drift well may be lightly (x⁻) or intermediately (x) doped with first polarity type dopants. For example, the dopant concentration of the drift well is about 1E12-1E14/cm². Other dopant concentrations may also be useful. For example, the dopant concentration may depend on the maximum or breakdown voltage requirement of the device.

In one embodiment, the second well, the first S/D region and gate are commonly coupled to a first terminal of the ESD device. The second S/D region is coupled to a second terminal of the ESD device. For example, the first terminal is a source terminal and the second terminal is a drain terminal. The source terminal, for example, is coupled to ground while the drain terminal, for example, is coupled to $V_{DD}$ or I/O pad. Other configurations of terminal connections to the ESD devices may also be useful.

In accordance with one embodiment, a fourth well 175 is provided. The fourth well, for example, serves as a second S/D or drain well. The drain well is disposed in the substrate under the drain region. The width of the fourth well may be, for example, narrower than, the same as, or larger than the width of the drain, depending on the operation voltage. The depth of the drain well is between the bottom of the drift isolation region and body well. Other depths for the drain well may also be useful.

The drain well includes first polarity type dopants. In one embodiment, the dopant concentration of the drain well is between the second S/D region and drift well. In one embodiment, the drain well may be intermediately (x) doped with first polarity type dopants.

We have discovered that, by providing a drain well under the drain, current is directed to flow in the vertical direction instead of in the horizontal direction. As such, base push-out phenomenon is relaxed or depressed at an early stage. This results in improved and more uniform turn on of the ESD device.

Figure 2B:
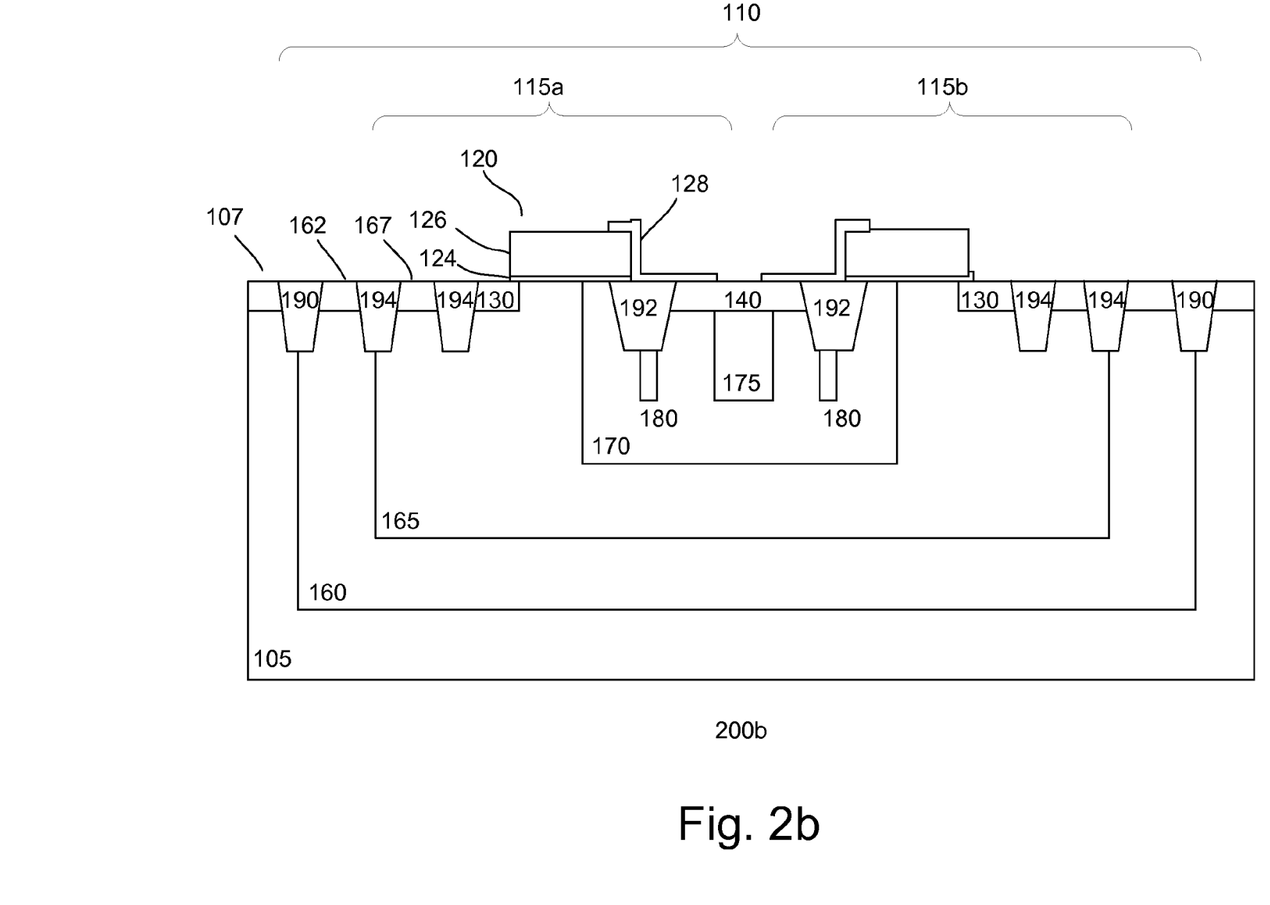

FIG. 2b shows a cross-sectional view of another embodiment of a device 200b. The device is similar to the device 200a of FIG. 2a and device 100b of FIG. 1b. Common elements may not be described or described in detail. As shown, a substrate 105 is provided with a device region isolated by a device isolation region 190. The device region includes first and second LD transistors 115a-b of an ESD protection circuit. The device region includes first, second, third and fourth doped wells 160, 165, 170 and 175. The first well may serve as an isolation well, the second well serves as a body well, the third well serves as a drift well and the fourth well serves as a drain well. Well contact regions 162 and 167 may be provided. Isolation regions, such as drift isolation regions 192 and well contact isolation regions 194 may be provided. Metal silicide contacts may be provided on the gate electrode, S/D and well contact regions.

In one embodiment, fifth wells 180 are provided. The fifth wells serve as LV well. The LV well includes second polarity type dopants. The LV wells are disposed within the drift well. In one embodiment, the LV wells are disposed between the drain well and edges of the drift well. As shown, the LV wells are disposed under the drift isolation regions 192.

The LV well has been found to increase the holding voltage ($V_h$) of the ESD device. We have discovered that by providing a LV well, the base push-out phenomenon is depressed. It is believed that the LV well provides a high resistance path for the current in the horizontal direction. As such, current is directed to flow in the vertical direction instead of in the horizontal direction. This results in improved and more uniform turn on of the ESD device.

Figure 2C:
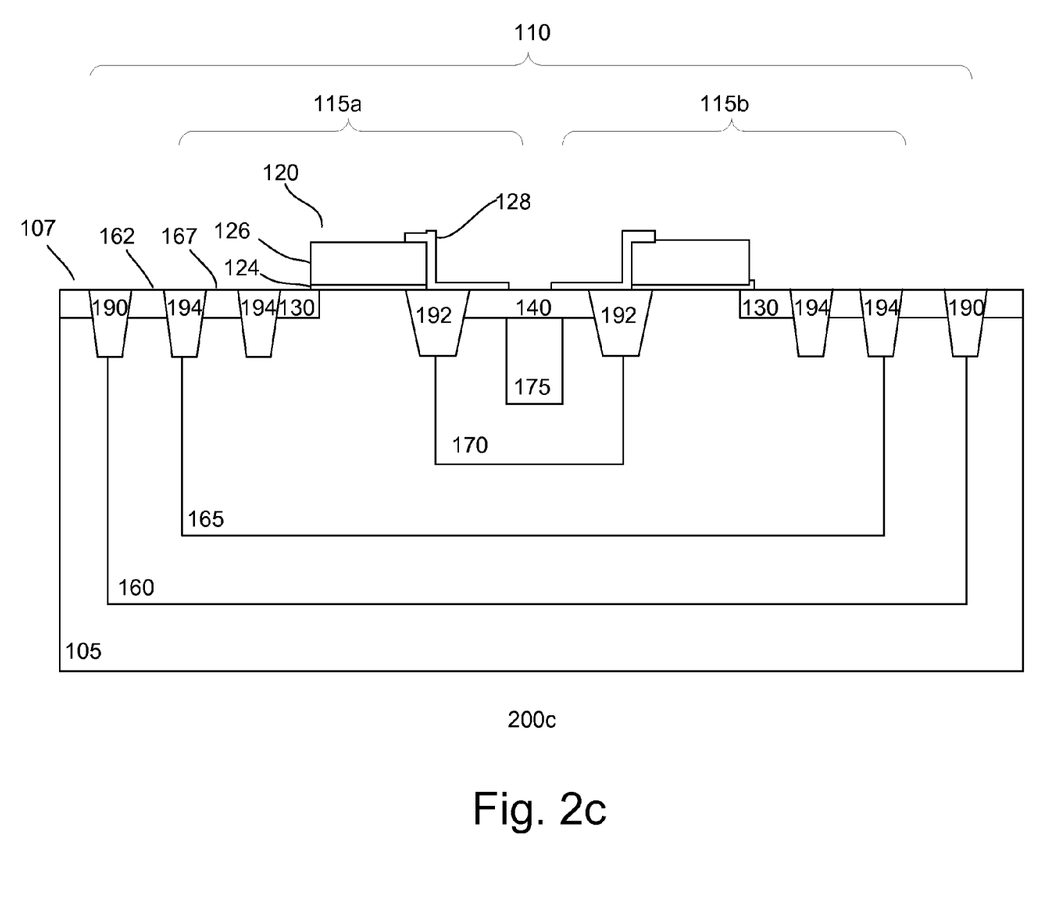

FIG. 2c shows a cross-sectional view of another embodiment of a device 200c. The device is similar to the device 200a of FIG. 2a and device 100c of FIG. 1c. Common elements may not be described or described in detail. As shown, a substrate 105 is provided with a device region isolated by a device isolation region 190. The device region includes first and second LD transistors 115a-b of an ESD protection circuit. The device region includes first, second, third and fourth doped wells 160, 165, 170 and 175. The first well may serve as an isolation well, the second well serves as a body well, the third well serves as a drift well and the fourth well serves as a drain well. Well contact regions 162 and 167 may be provided. Isolation regions, such as drift isolation regions 192 and well contact isolation regions 194 may be provided. Metal silicide contacts may be provided on the gate electrode, S/D and well contact regions.

In accordance with one embodiment, the drift well is narrowed. As shown, the drift well is narrowed so that the edges do not extend below the gates and do not extend into the channel region. For example, the inner edges of the drift well are below the center of the drift isolation regions 192.

The narrowing of the drift well has been found to increase the holding voltage ($V_h$) of the ESD device. We have discovered that by narrowing the drift well, the base push-out phenomenon is depressed. This increases the base of the parasitic bipolar transistor (BJT) of the ESD circuit, which reduces the base push-out phenomenon to result in improved uniform turn on of the ESD device.

Figure 2D:
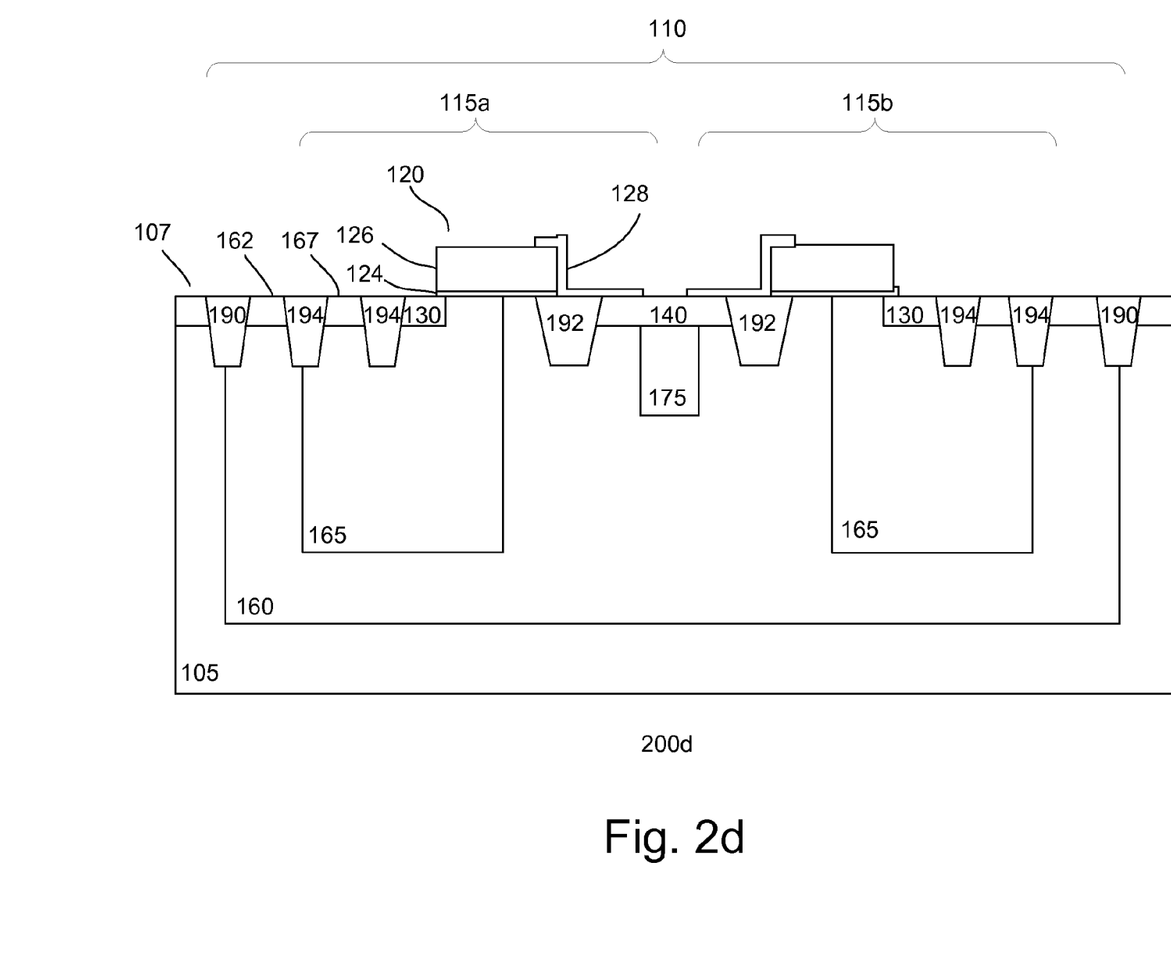

FIG. 2d shows a cross-sectional view of another embodiment of a device 200d. The device is similar to the device 200a of FIG. 2a and device 100d of FIG. 1d. Common elements may not be described or described in detail. As shown, a substrate 105 is provided with a device region isolated by a device isolation region 190. The device region includes first and second LD transistors 115a-b of an ESD protection circuit. The device region includes first, second, and fourth doped wells 160, 165 and 175. The first well may serve as an isolation well, the second wells serve as body wells and the fourth well serves as a drain well. Well contact regions 162 and 167 may be provided. Isolation regions, such as drift isolation regions 192 and well contact isolation regions 194 may be provided. Metal silicide contacts may be provided on the gate electrode, S/D and well contact regions.

In accordance with one embodiment, unlike device 200a of FIG. 2a, no drift well is provided. The body well, as shown, at least encompasses the first S/D region and a part of the gate. As shown, the body well encompasses the first S/D region and a part of the gate from a first side of the gate. Without the drift well, the drain is coupled to the channel by the isolation well. The drain well, for example, may be optimized depending on the total drain area. Eliminating the drift well eliminates base push-out phenomenon. The current is directed to flow only in the vertical direction. This results in improved and more uniform turn on of the ESD device. We have also discovered that this configuration improves ESD performance.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A device comprising:
   a substrate defined with a device region, the device region comprises an ESD protection circuit having a transistor, wherein the transistor includes
      a gate having first and second sides,
      a first diffusion region in the device region adjacent to the first side of the gate, wherein the gate overlaps the first diffusion region,
      a second diffusion region in the device region displaced away from the second side of the gate, wherein the first and second diffusion regions comprise dopants of a first polarity type, and
      a drift isolation region disposed between the gate and the second diffusion region;
   a first device well encompasses the device region;
   a second device well disposed within the first device well; and
   a drain well having dopants of the first polarity type is disposed under the second diffusion region and within the first device well.

2. The device of claim 1 wherein the first device well comprises dopants of the first polarity type and the second device well comprises dopants of a second polarity type.

3. The device of claim 2 wherein the first polarity type comprises n type and the second polarity type comprises p type.

4. The device of claim 1 wherein the second device well encompasses at least the first diffusion region and a part of the gate.

5. The device of claim 4 wherein the second device well encompasses the gate, the drift isolation region and the second diffusion region.

6. The device of claim 1 further comprises:
   a drift well disposed within the second device well.

7. The device of claim 6 wherein the first device well and the drift well comprise dopants of the first polarity type and the second device well comprises dopants of a second polarity type.

8. The device of claim 7 wherein the first polarity type comprises n type and the second polarity type comprises p type.

9. The device of claim 6 wherein the drift well encompasses the second diffusion region.

10. The device of claim 9 wherein the drift well extends under the gate from the second side of the gate.

11. The device of claim 1 wherein the gate overlaps the first diffusion region by about 0.1-0.5 μm.

12. The device of claim 1 wherein the drain well has a depth between the bottom of the drift isolation region and the second device well.

13. The device of claim 12 wherein the drain well has a width narrower than the second diffusion region.

14. A device comprising:
   a substrate having first and second device wells in a device region, wherein the second device well is disposed within the first device well;
   a transistor in the device region, wherein the transistor includes
      a gate having first and second sides, and
      a first diffusion region disposed adjacent to the first side of the gate, wherein the gate overlaps the first diffusion region and a second diffusion region displaced away from the second side of the gate, and
      a drift isolation region disposed between the gate and the second diffusion region; and
   a drain well is disposed under the second diffusion region and within the first device well.

15. The device of claim 14 wherein the first and second diffusion regions, the first device well and the drain well comprise dopants of a first polarity type and the second device well comprises dopants of a second polarity type.

16. The device of claim 15 wherein the first polarity type comprises n type and the second polarity type comprises p type.

17. The device of claim 14 wherein the second device well encompasses at least the first diffusion region and a part of the gate.

18. The device of claim 17 wherein the second device well encompasses the gate, the drift isolation region and the second diffusion region.

19. The device of claim 14 further comprises:
   a drift well disposed within the second device well.

20. The device of claim 14 wherein the gate overlaps the first diffusion region by about 0.1-0.5 μm.

* * * * *